(12) United States Patent
Cruz et al.

(10) Patent No.: US 9,408,330 B2
(45) Date of Patent: Aug. 2, 2016

(54) APPARATUS TO COOL A COMPUTING DEVICE

(75) Inventors: Ethan E. Cruz, LaGrangeville, NY (US); Michael F. Scanlon, Poughkeepsie, NY (US)

(73) Assignee: INTERNATIONAL BUSINESS MACHINES COPORATION, Armonk, NY (US)

( * ) Notice: Subject to any disclaimer, the term of this patent is extended or adjusted under 35 U.S.C. 154(b) by 979 days.

(21) Appl. No.: 13/449,768

(22) Filed: Apr. 18, 2012

(65) Prior Publication Data

US 2013/0277012 A1 Oct. 24, 2013

(51) Int. Cl.
*H05K 7/20* (2006.01)
*G06F 1/20* (2006.01)
*H01L 23/467* (2006.01)

(52) U.S. Cl.
CPC ............. *H05K 7/20736* (2013.01); *G06F 1/20* (2013.01); *H01L 23/467* (2013.01); *H01L 2924/0002* (2013.01)

(58) Field of Classification Search
CPC .......... H05K 7/20563; H05K 7/20727; H05K 7/20145; H05K 7/20572; H05K 7/20818
USPC ............... 361/679.5–679.54, 679.46–679.48, 361/688–690, 697
See application file for complete search history.

(56) References Cited

U.S. PATENT DOCUMENTS

| | | | | |
|---|---|---|---|---|
| 5,473,123 A | | 12/1995 | Yazici et al. | |
| 5,497,288 A | * | 3/1996 | Otis | H05K 7/20727 165/80.3 |
| 5,940,266 A | * | 8/1999 | Hamilton | H05K 7/20572 165/80.3 |
| 5,949,646 A | * | 9/1999 | Lee | H05K 7/2019 165/104.33 |
| 5,963,425 A | * | 10/1999 | Chrysler | G06F 1/20 165/104.33 |
| 6,193,011 B1 | | 2/2001 | Harris | |
| 6,697,255 B1 | | 2/2004 | Banton et al. | |
| 6,765,796 B2 | | 7/2004 | Hoffman et al. | |
| 6,927,976 B1 | | 8/2005 | Malone et al. | |
| 7,004,233 B2 | * | 2/2006 | Hasegawa | H05K 7/20909 165/122 |
| 7,016,193 B1 | * | 3/2006 | Jacques | H05K 7/20563 165/104.33 |
| 7,075,788 B2 | * | 7/2006 | Larson | G06F 1/20 165/185 |
| 7,079,387 B2 | * | 7/2006 | Brooks et al. | 361/679.51 |
| 7,079,388 B2 | | 7/2006 | Faneuf et al. | |
| 7,215,552 B2 | * | 5/2007 | Shipley | H05K 7/20563 165/104.33 |
| 7,589,978 B1 | | 9/2009 | Holdredge et al. | |
| 7,643,291 B2 | | 1/2010 | Mallia et al. | |
| 7,701,710 B2 | * | 4/2010 | Tanaka | H05K 7/20727 312/223.2 |
| 7,751,188 B1 | | 7/2010 | French et al. | |
| 7,778,013 B2 | | 8/2010 | Bruski et al. | |
| 7,813,121 B2 | | 10/2010 | Bisson et al. | |
| 7,869,209 B2 | | 1/2011 | Nemoz et al. | |
| 7,878,888 B2 | | 2/2011 | Rasmussen et al. | |

(Continued)

*Primary Examiner* — Robert J Hoffberg
*Assistant Examiner* — Hung Dang
(74) *Attorney, Agent, or Firm* — Cantor Colburn LLP; Margaret McNamara

(57) ABSTRACT

An apparatus to cool a computing device is provided and includes a structure. The structure includes a coolant moving device and a heat generating component. The structure is formed such that the coolant moving device is configured to generate a first flow of coolant into a plenum in a first direction and a second flow of coolant from the plenum in a second direction, which is transverse to the first direction, such that the coolant thermally interacts with the heat generating component. The structure further includes a plate interposed between the plenum and the heat generating component. The plate includes aerodynamic elements disposed to extend into the plenum.

16 Claims, 3 Drawing Sheets

(56) References Cited

U.S. PATENT DOCUMENTS

| | | |
|---|---|---|
| 7,903,403 B2 | 3/2011 | Doll et al. |
| 7,933,120 B2 * | 4/2011 | Tanaka et al. ............... 361/679.5 |
| 7,969,727 B2 | 6/2011 | Tozer et al. |
| 8,018,720 B2 | 9/2011 | Campbell et al. |
| 8,064,200 B1 | 11/2011 | West et al. |
| 8,780,551 B2 * | 7/2014 | Farnholtz ........... H05K 7/20563 361/679.48 |
| 2005/0162830 A1 * | 7/2005 | Wortman ........... H05K 7/20572 361/695 |
| 2005/0286222 A1 * | 12/2005 | Lucero ............... H05K 7/20563 361/690 |
| 2007/0159791 A1 | 7/2007 | Pongracz et al. |
| 2007/0274039 A1 * | 11/2007 | Hamlin ............... H05K 7/2019 361/695 |
| 2010/0033930 A1 * | 2/2010 | Wada ................. H05K 7/20581 361/695 |

* cited by examiner

APPARATUS TO COOL A COMPUTING DEVICE

BACKGROUND

Aspects of the present invention relate to an apparatus to cool a computing device.

As computer and electronic systems increase in function and are found in smaller and smaller packaging, an amount of space for things like thermal management is significantly reduced. Indeed, in air cooled systems, the space allowed for packaging empty air distribution plenums is frequently the first area that is removed or severely reduced in size in order to allow for either a smaller overall package, increased amounts of electronics or both. This reduction in the space for plenums can create non-uniform airflows especially near the entrance and exhaust of the air moving devices even when all of the air moving devices are working properly. The non-uniformities in the airflow patterns can have the effect of limiting the function of the system by not providing enough cooling air to critical electrical components.

There are generally five basic solutions that have been used to address these concerns. The first is to limit the function of the system based on the cooling that is provided by the design, by either reducing the amount of electronics or reducing the function of the hot electronics. The second is to increase the size of the package to allow for larger plenums. The third is to allow for higher temperatures on the critical components and accept the increased number of thermal related failures. The fourth is to use airflow impedances that more evenly distribute the airflow but significantly reduce the overall amount of airflow in the system. The fifth is to increase the amount of air in the system by making changes to the air moving devices (e.g., using higher speed fans, larger fans, etc.). Each of these options has obvious drawbacks in the overall operability of the system.

As an additional matter, when there is a failure in one or more of the air moving devices, the problems of non-uniform airflows may be exacerbated. For example, during a failure, the forced airflow condition can turn into a natural convection condition (i.e., airflow only due to the components getting so hot that the air near the components heats up and rises away allowing cooler air to replace it) very quickly. The only acceptable solution in such cases is often to turn off the function of those electronics which are affected and typically that means turning off the entire system.

SUMMARY

According to an aspect of the invention, an apparatus to cool a computing device is provided and includes a structure. The structure includes a coolant moving device and a heat generating component. The structure is formed such that the coolant moving device is configured to generate a first flow of coolant into a plenum in a first direction and a second flow of coolant from the plenum in a second direction, which is transverse to the first direction, such that the coolant thermally interacts with the heat generating component. The structure further includes a plate interposed between the plenum and the heat generating component. The plate includes aerodynamic elements disposed to extend into the plenum.

According to another aspect of the invention, an apparatus to cool a computing device is provided and includes a structure. The structure includes a coolant moving device and a heat generating component. The structure is formed such that the coolant moving device is configured to draw coolant into a plenum in a first direction and to draw the coolant from the plenum in a second direction, which is transverse to the first direction, such that the coolant thermally interacts with the heat generating component. The structure further includes an intake plate interposed between the plenum and the heat generating component. The intake plate is perforated and includes a baffles disposed to extend into the plenum to aerodynamically interact with a flow of the coolant.

According to yet another aspect of the invention, an apparatus to cool a computing device is provided and includes a structure. The structure includes a coolant moving device and a heat generating component. The structure is formed such that the coolant moving device is configured to force coolant into a plenum in a first direction and to force the coolant from the plenum in a second direction, which is transverse to the first direction, such that the coolant thermally interacts with the heat generating component. The structure further includes an exhaust plate interposed between the plenum and the heat generating component. The exhaust plate is partially open and partially perforated and includes baffles disposed to extend into the plenum to aerodynamically interact with a flow of the coolant.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
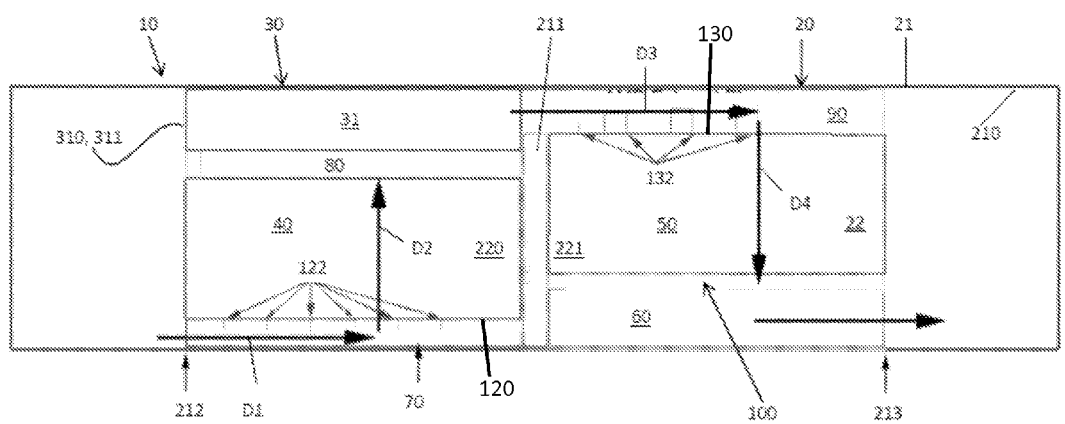
FIG. 1 is a side schematic view of an apparatus to cool a computing device in accordance with an exemplary embodiment.

With reference now to FIG. 1, an apparatus 10 to cool a computing device or components thereof is provided. The apparatus 10 may be a personal computing apparatus, a portable computing apparatus, a server or another similar type of computing device. In any case, the apparatus 10 includes a structure 20. The structure 20 may have a volumetric form with a generally rigid frame 21 that defines an interior 22 in which various components of the apparatus 10 are housed. The frame 21 includes an exterior housing 210 and a mid-plane 211. The exterior housing 210 may include various features that serve to facilitate connections between external devices and the components housed within the interior 22. The exterior housing 210 may further include front ductwork 212 and back ductwork 213, which respectively serve as an inlet and an outlet to allow for a flow of coolant (i.e., airflow) into and out of the interior 22. The mid-plane 211 is anchored on the exterior housing 210 and divides the interior 22 into a front section 220 associated with the front ductwork 212 and a back section 221 associated with the back ductwork 213.

The components of the apparatus 10 include, but are not limited to, at least a coolant moving device 30 and at least a first heat generating component 40, a second heat generating component 50 and a third heat generating component 60. The coolant moving device 30 may be provided, for example, as a fan or blower in a single or dual fan/blower configuration. As shown in FIG. 1, the coolant moving device 30 may be provided in a dual fan configuration 31 with first and second lateral fans 310, 311 operating in parallel with one another to generate a flow of coolant that proceeds substantially along a mid-line of the apparatus 10 downstream from the coolant moving device 30. In accordance with embodiments, the coolant may be ambient air, conditioned air or some other similar fluid.

The first heat generating component 40 may be provided as a set of front input/output (I/O) cards. The first heat generating component 40 is fluidly disposed upstream from the coolant moving device 30 and is anchored within the front section 220 of the interior 22 such that a lower front plenum 70 and an upper front plenum 80 (i.e., an air moving device (AMD) inlet plenum) are respectively defined. The lower front plenum 70 is defined between the exterior housing 210 and a lower portion of the first heat generating component 40 and proximate to the front ductwork 212. The upper front plenum 80 is defined between an upper portion of the first heat generating component 40 and the coolant moving device 30.

The second heat generating component 50 may be provided as a set of back I/O cards at a side of the mid-plane 211 opposite from the first heat generating component 40. The second heat generating component 50 is fluidly disposed downstream from the coolant moving device 30 and is anchored within the back section 221 of the interior 22 such that an upper rear plenum 90 (i.e., an AMD exhaust plenum) is defined between the exterior housing 210 and an upper portion of the second heat generating component 50. The third heat generating component 60 may be provided as a direct current (DC) power supply component and is fluidly disposed downstream from the second heat generating component 50. The third heat generating component 60 is anchored within the back section 221 of the interior 22 to define a lower rear plenum 100 (i.e., a DC power supply inlet plenum) between the second heat generating component 50 and the third heat generating component 60.

That is, the structure 20 is formed such that the coolant moving device 30 is configured to generate at least first and second flows of coolant. In the first flow of coolant, the coolant moving device 30 draws coolant into the lower front plenum 70 via the front ductwork 212 in a first direction D1. In the second flow of coolant, the coolant moving device 30 further draws coolant from the lower front plenum 70 in a second direction D2, which is oriented transversely with respect to the first direction D1, such that the coolant thermally interacts with the first heat generating component 40.

The structure 20 is further formed such that the coolant moving device 30 is configured to generate at least third and fourth flows of coolant. In the third flow of coolant, the coolant moving device 30 forces coolant into the upper rear plenum 90 in a third direction D3 that is similarly oriented as the first direction D1. In the fourth flow of coolant, the coolant moving device 30 further forces coolant from the upper rear plenum 90 in a fourth direction D4, which is opposite the second direction D2, such that the coolant thermally interacts with the second heat generating component 50 and, subsequently, the third heat generating component 60.

Although the structure 20 is described above as having the mid-plane 211 with the first heat generating component 40 anchored within the front section 220 of the interior 22 and the second and third heat generating components 50 and 60 anchored within the back section 221 of the interior 22, it is to be understood that other embodiments are possible. For example, the structure 20 may only include an equivalent of the front section 220 or the back section 221. In the former case, only the first heat generating component 40 would be provided and, in the latter case, only the second and third heat generating components 50 and 60 would be provided. In addition, it is to be understood that in all embodiments any one of the first, second and third heat generating components 40, 50 and 60 may be removed or discarded from the apparatus 10.

Figure 2:
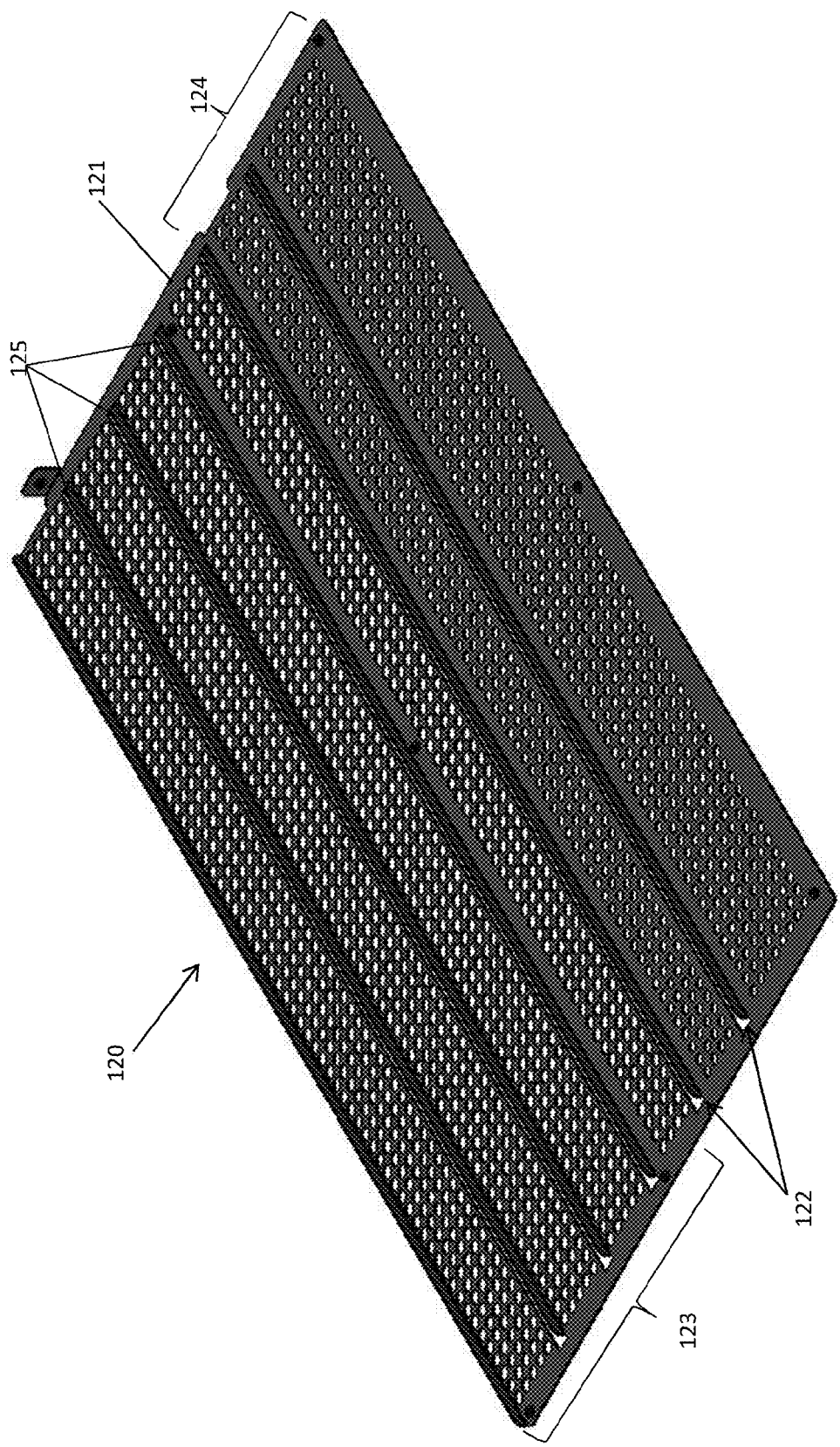
FIG. 2 is a perspective view of an intake plate of the apparatus of FIG. 1.

With reference to FIGS. 1 and 2, for a case in which the first heat generating component 40 is provided in the apparatus 10, an intake plate 120 is interposed between the lower front plenum 70 and the first heat generating component 40. The intake plate 120 has a perforated body 121 and includes aerodynamic elements, such as a set of baffles 122. The baffles 122 are disposed to extend into the lower front plenum 70 to strengthen the intake plate 120, which may be made from sheet metal, for example, and to aerodynamically interact with a flow of the coolant such that pressures within the lower front plenum 70 are maintained substantially uniformly and such that the second flow of the coolant 111 flows substantially evenly from the lower front plenum 70 and toward and the first heat generating component 40 via the perforations defined through the perforated body 121.

In the absence of the baffles 122, the coolant moving device 30 may generate a coolant recirculation loop that could degrade cooling of the first heat generating component 40. In this case, while coolant could still be drawn from the lower front plenum 70 toward the first heat generating component 40, the presence of the coolant recirculation loop results in substantially uneven coolant flow toward the first heat generating component 40 and thus uneven cooling. In a case where the coolant moving device 30 is provided in a dual fan configuration 31 with first and second lateral fans 310, 311, persistence and effects of the coolant recirculation loop may be pronounced or exacerbated upon failure of one of the first and second lateral fans 310, 311.

When the intake plate 120 includes the baffles 122, however, the baffles 122 reduce or substantially eliminate the coolant recirculation loop even upon failure of one of the first and second lateral fans 310, 311 and an anti-recirculation door fails to seal local recirculation. To achieve this, the baffles 122 act as passive elements to trip coolant flow into the lower front plenum 70. The tripped coolant turns from the first direction D1 to the second direction D2 and helps to substantially evenly distribute coolant flow in the lower front plenum 70 in the front-to-back direction (i.e., first direction D1) and the side-to-side direction.

In accordance with embodiments and, as shown in FIG. 2, a perforation pattern of the perforated body 121 of the intake plate 120 may be varied along the first direction D1. In an exemplary embodiment, the varied perforation pattern may include first groups 123 of relatively small perforations defined in a position that would be proximate to the front ductwork 212 and second groups 124 of relatively large perforations defined in a position that would be remote from the front ductwork 212. Also, the baffles 122 may be non-uniformly separated from one another along the first direction D1 and each one of the baffles 122 may have a similar shape and size as the others. In an exemplary embodiment, each one of the baffles 122 may be formed as a substantially straight rib 125 that is disposed in parallel with the others.

Figure 3:
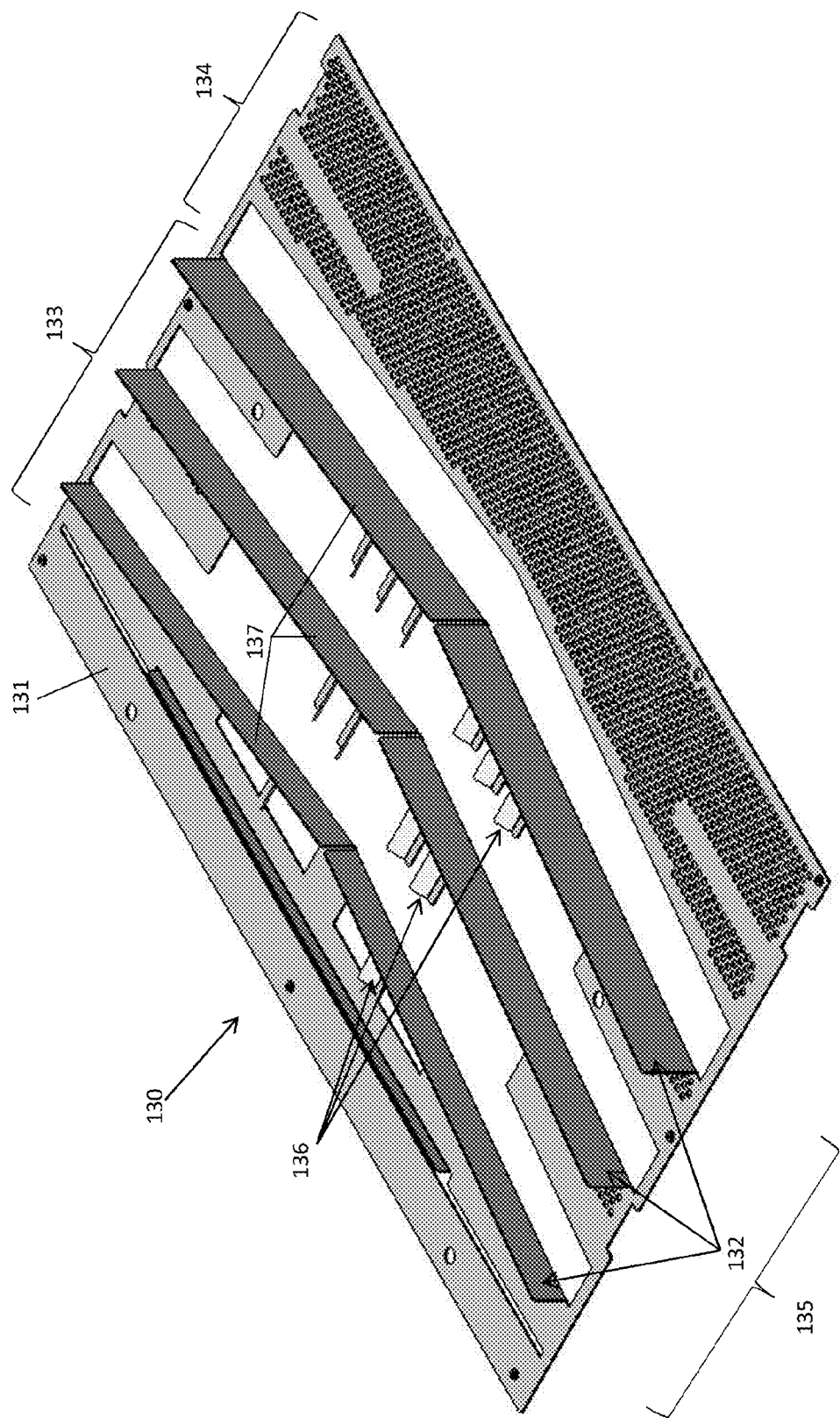
FIG. 3 is a perspective view of an exhaust plate of the apparatus of FIG. 1.

With reference to FIGS. 1 and 3, for a case in which at least the second heat generating component 50 is provided in the apparatus 10, an exhaust plate 130 is interposed between the upper rear plenum 90 and the second heat generating component 50. The exhaust plate 130 has a partially open and partially perforated body 131 and includes aerodynamic elements, such as a set of baffles 132. The baffles 132 are disposed to extend into the upper rear plenum 90 to strengthen the exhaust plate 130, which may be made from sheet metal, for example, and to aerodynamically interact with a flow of the coolant such that pressures within the upper rear plenum 90 are maintained substantially uniformly and such that the fourth flow of the coolant 113 flows substantially evenly from the upper rear plenum 90 and toward the second heat generating component 50 via openings and perforations defined through the partially open and partially perforated body 131.

As noted above, in the absence of the baffles 132, the coolant moving device 30 may generate a coolant recirculation loop that could degrade cooling of the second heat generating component 50. In this case, while coolant could still be forced from the upper rear plenum 90 and toward the second heat generating component 50, the presence of the coolant recirculation loop results in substantially uneven coolant flow toward the second heat generating component 50 and thus uneven cooling. In a case where the coolant moving device 30 is provided in a dual fan configuration 31 with first and second lateral fans 310, 311, persistence and effects of the coolant recirculation loop may be pronounced or exacerbated upon failure of one of the first and second lateral fans 310, 311.

When the exhaust plate 130 includes the baffles 132, however, the baffles 132 reduce or substantially eliminate the coolant recirculation loop even upon failure of one of the first and second lateral fans 310, 311. To achieve this, the baffles 132 act as passive elements that trip coolant flow into the upper rear plenum 90. The tripped coolant turns from the third direction D3 to the fourth direction D4 and helps to substantially evenly distribute coolant flow in the upper rear plenum 90 in the front-to-back direction (i.e., third direction D3) and the side-to-side direction. In some cases, the tripped coolant actually sticks to and flows around the baffles 132 toward the second heat generating component 50.

In accordance with embodiments and, as shown in FIG. 3, the exhaust plate has a partially open portion 133 and a partially perforated portion 134. The baffles 132 traverse the exhaust plate 130 at the partially open portion 133 and may have a chevron arrangement 135 with each baffle 132 tapering towards a point defined along the mid-line of the apparatus 10. The exhaust plate 130 may further include secondary baffles 136 that are respectively coupled to each of the (now primary) baffles 132. In accordance with embodiments, the secondary baffles 136 increase in number along the third direction D3. When assembled together, the baffles 132 encourage flow of the coolant toward the mid-line of the apparatus 10 and the upper rear plenum 90 and toward the second heat generating component 50. The secondary baffles 136 then divert flow of the coolant away from the mid-line such that the coolant flows substantially evenly toward the second heat generating component.

In accordance with further embodiments, at least the baffles 132 may be formed of individual ribs 137 that increase in height and/or size along the third direction D3. This height and/or size increase is reflective of the relatively high pressure at an outlet of the coolant moving device 30 and the observation that flow of the coolant may tend to stick to and thus flow around the baffles 132.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An apparatus to cool a computing device, comprising:
a structure and including a first and second heat generating components and a coolant moving device fluidly interposed between the first and second heat generating components, the coolant moving device is configured to generate:
a first coolant flow from a front ductwork of the structure into a first plenum in a first direction and
a second coolant flow from the first plenum and into a second plenum in a second direction transverse to the first direction whereby coolant thermally interacts with the first heat generating component
a third coolant flow from the second plenum into a third plenum in a third direction parallel with the first direction,
a fourth coolant flow from the third plenum and into a fourth plenum in a fourth direction transverse to the third direction whereby the coolant thermally interacts with the second heat generating component, and
a fifth coolant flow from the fourth plenum out of a rear ductwork of the structure;
a first plate interposed between the first plenum and the first heat generating component and a second plate interposed between the third plenum and the second heat generating component, the first and second plates each including:
a body extending along the first and third directions, respectively, and
aerodynamic elements disposed to extend from the body and into the first and third plenums along directions opposite to the second and fourth directions, respectively, and to interact with the coolant to convert the first and third coolant flows into the second and fourth coolant flows.

2. The apparatus according to claim 1, wherein:
the coolant moving device comprises first and second lateral fans operating in parallel and configured to generate the first flow, the second flow via perforations in the first plate, the third flow, the fourth flow via perforations and openings in the second plate and the fifth flow,
the perforations and the aerodynamic elements of the first plate vary along the first direction,
the perforations, the openings and the aerodynamic elements of the second plate vary along the third direction such that thermal interaction of the coolant with the first and second heat generating components is distributed evenly in the first and third directions and in side-to-side directions defined transversely to the first-fourth directions, and
the aerodynamic elements of the second plate comprise:
baffles in a chevron arrangement with increasing heights along the third direction that traverse the second plate at each of the openings to encourage the third flow toward a mid-line of the third plenum; and
secondary baffles respectively coupled to each of the baffles to divert coolant flow away from the mid-line.

3. The apparatus according to claim 2, wherein the structure further includes a midplane disposed between the first and second heat generating components.

4. The apparatus according to claim 2, wherein the structure includes a third heat generating component downstream from the second heat generating component.

5. An apparatus to cool a computing device, comprising:
a coolant moving device comprising first and second lateral fans operating in parallel;
a first structure including a first heat generating component upstream from the coolant moving device, the first structure being formed such that the coolant moving device is configured to draw coolant into a first plenum in a first direction and to draw the coolant from the first plenum in a second direction, which is transverse to the first direction, such that the coolant thermally interacts with the first heat generating component;
an intake plate interposed between the first plenum and the first heat generating component, the intake plate including a perforated body extending along the first direction and intake baffles disposed to extend from the body and into the first plenum along a direction opposite to the second direction to aerodynamically interact with a flow of the coolant such that the coolant is redirected from flowing in the first direction to flowing in the second direction;
a second structure including a second heat generating component downstream from the coolant moving device, the second structure being formed such that the coolant moving device is configured to force the coolant into a second plenum in a first direction and to force the coolant from the second plenum in a third direction, which is transverse to the first direction, such that the coolant thermally interacts with the second heat generating component; and
an exhaust plate interposed between the second plenum and the second heat generating component, the exhaust plate including an exhaust body extending along the first direction that is partially open and partially perforated and exhaust baffles disposed to extend from the body and into the second plenum along a direction opposite to the third direction to aerodynamically interact with a flow of the coolant such that the coolant is redirected from flowing in the first direction to flowing in the second direction.

6. The apparatus according to claim 5, wherein a perforation pattern of the intake plate is varied along the first direction.

7. The apparatus according to claim 6, wherein the intake baffles are non-uniformly separated from one another along the first direction.

8. The apparatus according to claim 7, wherein the intake baffles have same shapes and sizes.

9. The apparatus according to claim 8, wherein the intake baffles are substantially straight.

10. The apparatus according to claim 9, wherein the intake baffles are disposed in parallel.

11. The apparatus according to claim 5, wherein the exhaust baffles traverse the exhaust plate where the exhaust plate is partially open.

12. The apparatus according to claim 11, wherein the exhaust baffles have a chevron arrangement.

13. The apparatus according to claim 12, wherein the exhaust plate further includes secondary baffles respectively coupled to each of the exhaust baffles.

14. The apparatus according to claim 13, wherein the exhaust baffles increase in height along the first direction.

15. The apparatus according to claim 14, wherein the exhaust baffles encourage flow of the coolant toward a mid-line of the plenum and the secondary baffles divert flow of the coolant away from the mid-line.

16. An apparatus to cool a computing device, comprising:
first and second lateral fans operating in parallel;
a first heat generating component upstream from the first and second lateral fans whereby the first and second lateral fans draw coolant into and from a first plenum in first and second transverse directions;
a first heat generating component upstream from the first and second lateral fans whereby the first and second lateral fans draw a coolant from an intake ductwork into a first plenum in a first direction, and exits from the first plenum in a second direction, which is transverse to the first direction;
an intake plate interposed between the first plenum and the first heat generating component and comprising a perforated body extending along the first direction and intake baffles extending into the first plenum along a direction opposite to the second direction to redirect coolant flow from the first to the second direction;
a second heat generating component downstream from the first and second lateral fans whereby the first and second lateral fans force the coolant into a second plenum in the first direction, and exits from the second plenum in a third direction, which is transverse to the first direction; and
an exhaust plate interposed between the second plenum and the second heat generating component and comprising an exhaust body extending along the first direction that is partially open and partially perforated and exhaust baffles extending into the second plenum along a direction opposite to the third direction to redirected the coolant flow from the first to the third direction,
wherein the exhaust baffles comprise:
primary baffles in a chevron arrangement with increasing heights that traverse the exhaust plate at each of the openings to encourage coolant flow toward a mid-line of the second plenum; and
sets of two or more secondary baffles respectively coupled to each of the primary baffles to divert the coolant flow away from the mid-line.

* * * * *